United States Patent
Kim et al.

(10) Patent No.: US 8,669,024 B2
(45) Date of Patent: Mar. 11, 2014

(54) METHOD OF FABRICATING COLOR FILTER SUBSTRATE AND INFRARED HEATING APPARATUS FOR THE SAME

(75) Inventors: Chulho Kim, Paju-si (KR); Jonggo Lim, Paju-si (KR); Samyeoul Kim, Paju-si (KR); Taeyoung Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 1535 days.

(21) Appl. No.: 12/003,777

(22) Filed: Dec. 31, 2007

(65) Prior Publication Data

US 2008/0226993 A1    Sep. 18, 2008

(30) Foreign Application Priority Data

Mar. 14, 2007  (KR) ........................ 10-2007-0024833

(51) Int. Cl.
 *G02B 5/20*  (2006.01)
 *G03F 7/40*  (2006.01)

(52) U.S. Cl.
 USPC ............................................ 430/7; 430/330

(58) Field of Classification Search
 None
 See application file for complete search history.

(56) References Cited

U.S. PATENT DOCUMENTS

2003/0143473 A1 * 7/2003 Goto ................................ 430/7
2006/0194128 A1 * 8/2006 Araki ............................... 430/7

FOREIGN PATENT DOCUMENTS

| JP | 10-213910 A | * | 8/1998 |
| JP | 11-337724 A | * | 12/1999 |
| JP | 2006-317776 | | 11/2006 |
| KR | 10-2005-0119023 | | 12/2005 |

OTHER PUBLICATIONS

Computer-generated translation of JP 11-337724 (Dec. 1999).*
Computer-generated translation of JP 10-213910 (Aug. 1998).*

* cited by examiner

*Primary Examiner* — John A. McPherson
(74) *Attorney, Agent, or Firm* — McKenna Long & Aldridge, LLP

(57) ABSTRACT

A method of fabricating a color filter substrate and an infrared heating apparatus for the same are provided. A post-baking process is replaced with an infrared irradiation method with a rapid thermal transfer characteristic. Therefore, the yield and production efficiency can be improved. The method of fabricating a color filter substrate includes coating a color resist layer on an entire surface of a substrate, placing a mask on the substrate and exposing the substrate, developing the exposed color resist layer to form a color filter pattern, and curing the color filter pattern by irradiating the substrate with infrared rays.

9 Claims, 13 Drawing Sheets

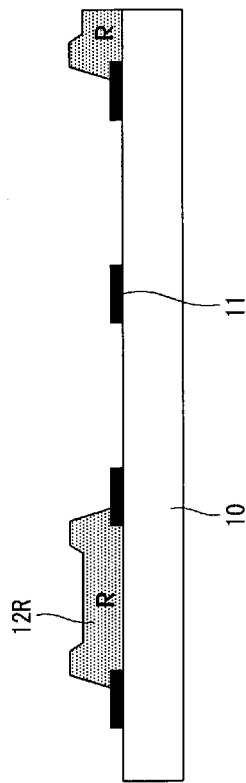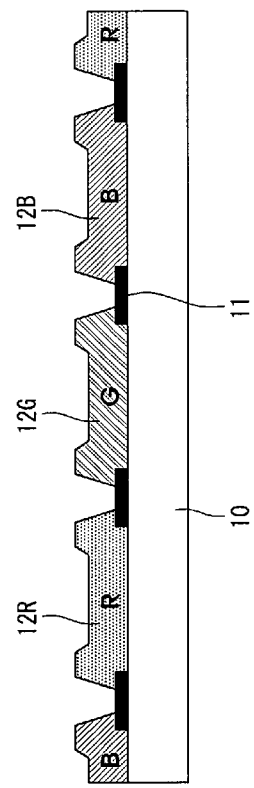

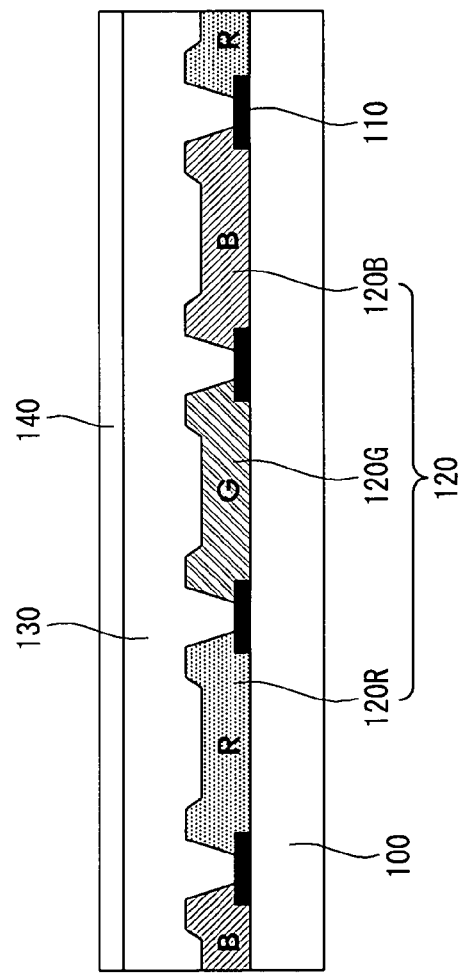

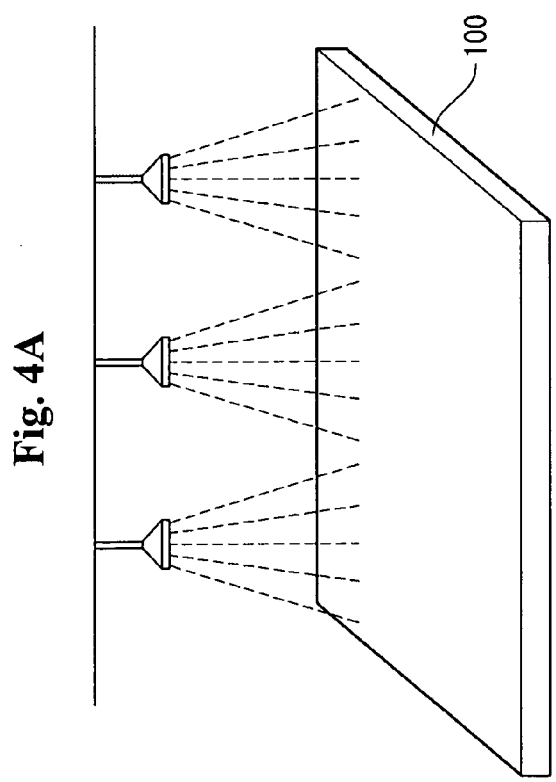

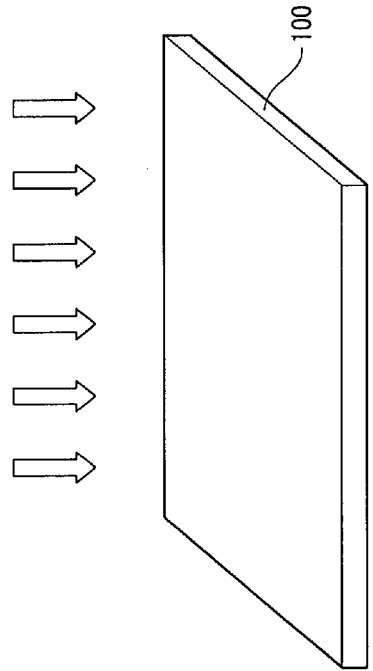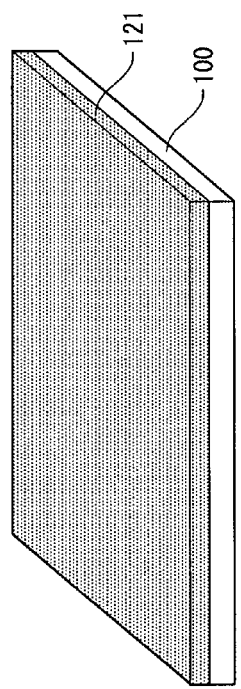

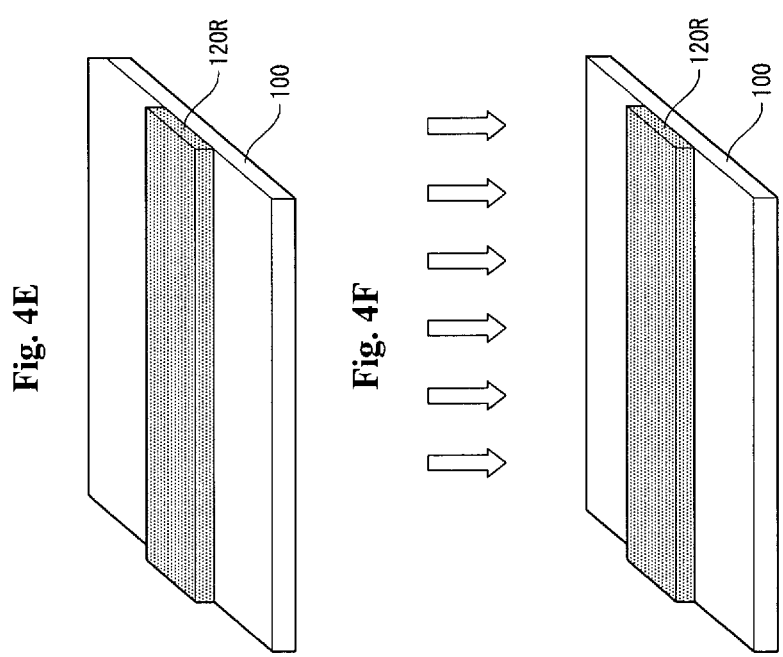

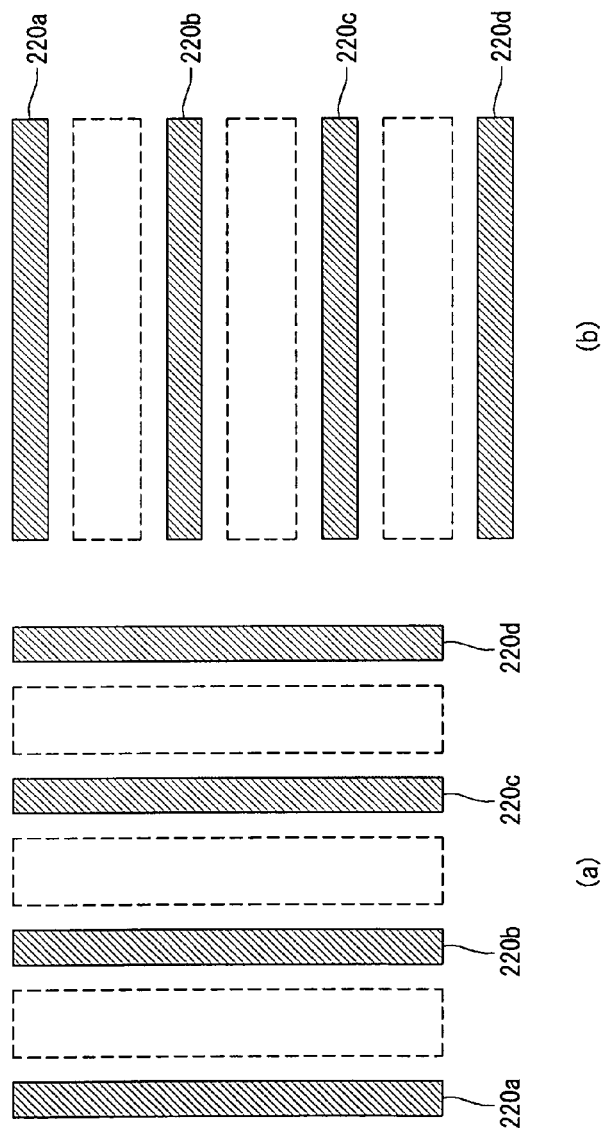

METHOD OF FABRICATING COLOR FILTER SUBSTRATE AND INFRARED HEATING APPARATUS FOR THE SAME

This application claims the benefit of Korean Patent Application No. 10-2007-024833, filed on Mar. 14, 2007, which is hereby incorporated by reference for all purposes as if fully set forth herein.

BACKGROUND OF THE INVENTION

1. Field of the Invention

The present invention relates to a method of fabricating a color filter substrate and an infrared heating apparatus for the same.

2. Description of the Related Art

In recent years, there is an increased importance in flat panel display (FPD) devices that are suitable for new environments, due to miniaturization, thinning, and light-weight electronic devices as well as lower voltage and lower power of various electronic devices in line with the rapid development of semiconductor technologies. Accordingly, several kinds of FPDs, such as a liquid crystal display (LCD), a plasma display panel (PDP), and an organic electroluminescent display (OELD) devices, have been developed.

Of them, some FPDs such as a LCD include three kinds of color filters respectively corresponding to the three primary colors of red (R), green (G), and blue (B) in order to implement colors, and represent multi-colors or natural colors by mixing light emitted from the respective color filters.

FIGS. 1A to 1E are views illustrating a related art method of fabricating a color filter substrate. FIG. 1 illustrates a color filter equipped with a LCD.

As shown in FIG. 1A, pixel regions are defined on a transparent substrate 10, and black matrices 11 for shielding a light source between the pixel regions are formed on the transparent substrate 10.

As shown in FIG. 1B, a color resist 12 is coated to cover the entire surface of the substrate 10 including the black matrices 11.

As shown in FIG. 1C, a color filter pattern of a specific color (for example, a red (R) color filter pattern) is formed by exposing the color resist 12 using a mask 13.

A red (R) color filter 12R as shown in FIG. 1D is formed through development, dry, and cleaning processes.

Green (G) and blue (B) color filters 12G and 12B are formed on the substrate 10 by repeatedly performing the processes described with reference to FIGS. 1B to 1D, as shown in FIG. 1E.

In order to form the color filters 12R, 12G, and 12B of the three colors as described above, the processes, such as cleaning, coating, exposure, development, and post-baking, must be performed on each of the color filters 12R, 12G, and 12B.

In other words, assuming that the color filters are formed in order of red (R), green (G), and blue (B), the red (R) color filter 12R that is first formed experiences a total of three post-baking processes, and the green (G) color filter 21G that is formed next experiences a total of two post-baking processes.

As the same process is repeated several times (three times or more) as described above, there are problems in which a clean room space and operating expenses thereof, an equipment investment cost, a turnaround time, production efficiency, and so on for fabricating the color filter substrate are consumed several times.

Meanwhile, the post-baking process is for hardening a pattern and stabilizing a pattern shape, by making volatile a volatile solvent in each of the color filter patterns 21R, 21G, and 21B. The post-baking process is performed in such a manner that the substrate 10 is loaded in a chamber, and the temperature of the substrate 10 is then raised using a thermal convection method.

However, the post-baking process employing the thermal convection method is problematic in that it must employ a gas that becoming a convection mediator within the chamber and requires a significantly long time (for example, 30 minutes or more) in order to raise the temperature of the substrate 10 to a certain temperature (for example, 230 degrees Celsius or less).

In particular, in the event that since one chamber is constructed of multiple stages, a plurality of the substrates 10 are loaded into one chamber and a post-baking process is performed on the substrate 10 at a time, a time necessary for temperature rise is increased significantly and a carrier robot must be used in order to load the substrate 10 into each stage or discharge the substrate 10 from each stage.

SUMMARY OF THE INVENTION

Accordingly, the present invention is directed to method of fabricating a color filter substrate and infrared heating apparatus for the same that substantially obviates one or more problems due to limitations and disadvantages of the related art.

An advantage of the present invention is to provide a method of fabricating a color filter substrate and an infrared heating apparatus for the same, in which the post-baking process can be substituted using an infrared irradiation method with a rapid thermal transfer characteristic.

Another advantage of the present invention is to provide a method of fabricating a color filter substrate and an infrared heating apparatus for the same, in which it can reduce a clean room space and operating expenses thereof, an equipment investment cost, and a turnaround time, and improve the yield and production efficiency accordingly.

Another advantage of the present invention is to provide a method of fabricating a color filter substrate and an infrared heating apparatus for the same, in which a carrier robot is not required when performing the post-baking process on several substrates at a time, and the working ratio of equipment is high.

Additional features and advantages of the invention will be set forth in the description which follows, and in part will be apparent from the description, or may be learned from practice of the invention. These and other advantages of the invention will be realized and attained by the structure and methods particularly pointed out in the written description and claims hereof as well as the appended drawings.

To achieve these and other advantages and in accordance with the purpose of the invention, as embodied and broadly described herein, a method of fabricating a color filter substrate includes coating a color resist layer on an entire surface of a substrate, placing a mask on the substrate and exposing the substrate, developing the exposed color resist layer to form a color filter pattern, and curing the color filter pattern by irradiating the substrate with infrared rays.

In another aspect of the present invention, a method of fabricating a color filter substrate includes coating a first color resist layer on an entire surface of a substrate, exposing the substrate, developing the exposed first color resist layer to form a first color filter pattern, coating a second color resist layer over the entire surface of the substrate, exposing the substrate, developing the exposed second color resist layer to form a second color filter pattern, and curing the second color filter pattern by irradiating the substrate with infrared rays during a final heating time.

In another aspect of the present invention, an infrared heating apparatus includes a main body portion having an inlet portion disposed on one side and an outlet portion disposed on the other side, wherein the inlet portion is configured to receive a substrate to be heated and the outlet portion is configured to discharge a heated substrate, infrared radiation heaters disposed on upper and lower portions of the substrate, respectively, disposed opposite to each other over an internal space of the main body portion, and configured to irradiate infrared rays to the substrate, infrared reflectors disposed on an inner wall of the main body portion and configured to focus infrared rays radiated from the infrared radiation heaters, an exhaust portion configured to discharge gases generated when the substrate is heated to the outside, and a controller configured to control a heating time of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 1A, 1B, 1C, 1D and 1E are views illustrating a related art method of fabricating a color filter substrate;

FIG. 2 shows a construction of a color filter substrate according to an embodiment of the present invention;

FIGS. 4A, 4B, 4C, 4D, 4E, 4F and 4G are views illustrating, in detail, each step of the method shown in FIG. 3;

FIG. 7 is a view illustrating a case where part of the infrared heating apparatus shown in FIG. 6 is modified and includes views (a) and (b).

DETAILED DESCRIPTION OF THE ILLUSTRATED EMBODIMENTS

Figure 1A:
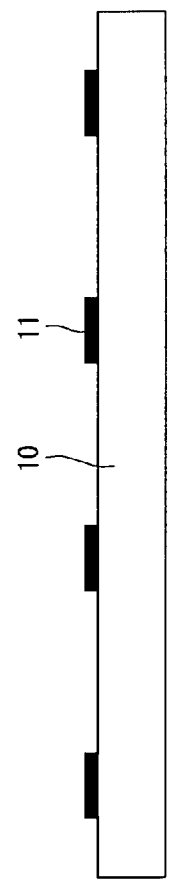
Figure 1B:
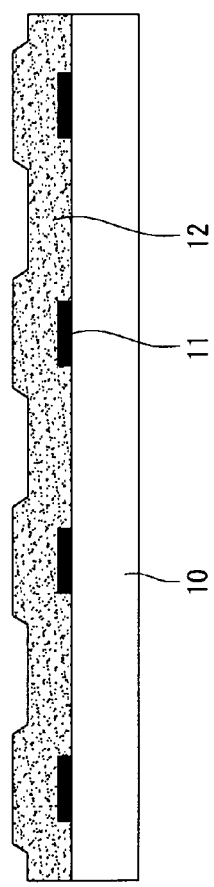
Figure 1C:
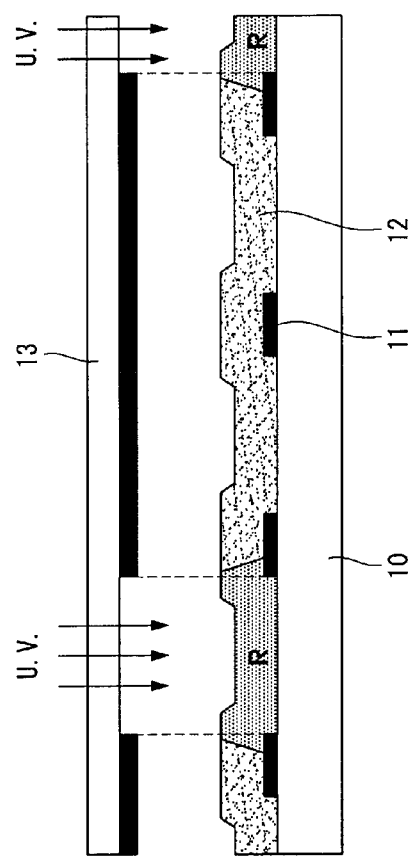

Reference will now be made in detail to embodiments of the present invention, examples of which are illustrated in the accompanying drawings.

FIG. 2 shows a construction of a color filter substrate according to an embodiment of the present invention. This drawing illustrates a construction of a color filter substrate used for a LCD.

Referring to FIG. 2, a color filter substrate 100 includes black matrices 110, color filter layers 120, an over-coating film 130, a transparent electrode layer 140, and so on.

A layer that is first fabricated in the color filter substrate 100 is the black matrix 110 used as a light-shielding layer. The black matrix 110 is disposed near the boundary of pixel regions. The black matrix 110 functions to separate color filters 120R, 120G, and 120B of red (R), green (G), and blue (B) in a specific pattern, such as stripe, so that they correspond to the respective pixel regions and also shield light of regions other than the pixel regions, thus improving the contrast ratio (C/R).

The black matrix 110 may be made of opaque metal, such as chrome (Cr) or chrome oxide ($Cr_2O_3$), or a black resin-based material that absorbs light.

The color filter layer 120 includes color filters 120R, 120G, and 120B of red (R), green (G), and blue (B) and configured to represent colors is formed at a portion corresponding to each pixel region The over-coating film 130 for polishing, the transparent electrode layer 140 for forming an electric field or implementing a uniform electric field, etc. may be additionally formed over the color filter layer 120.

Figure 3:
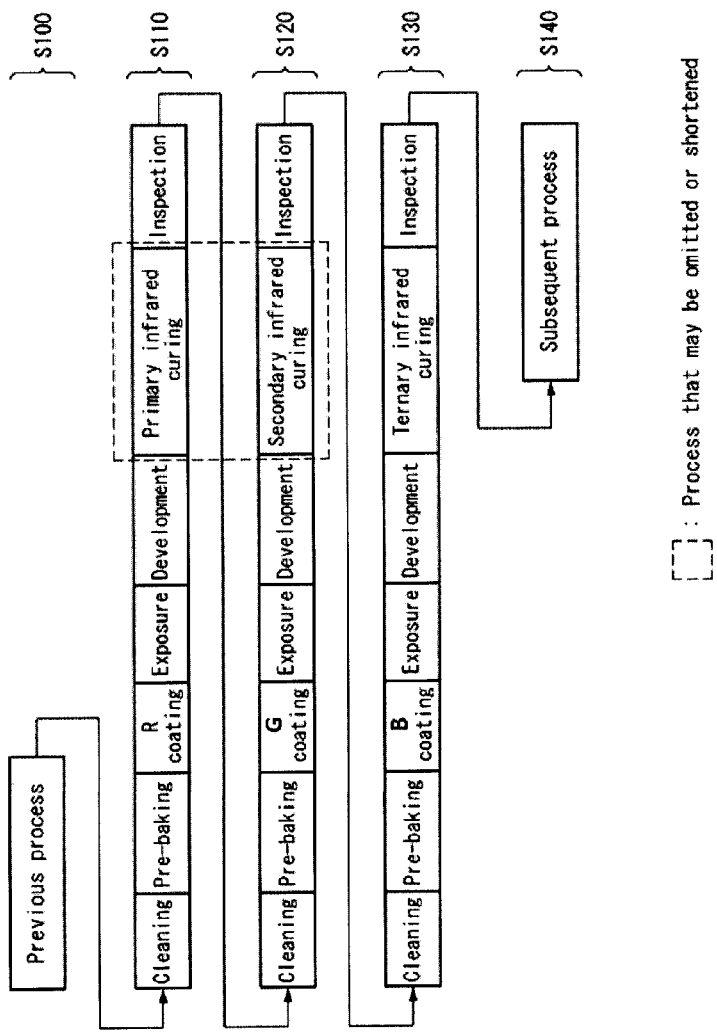
FIG. 3 is a view illustrating a method of fabricating the color filter substrate according to an embodiment of the present invention.

FIG. 3 is a view illustrating a method of fabricating the color filter substrate according to an embodiment of the present invention. FIGS. 4A to 4G are views illustrating, in detail, each step of the method shown in FIG. 3.

Referring to FIG. 3, a method of fabricating the color filter substrate 100 includes forming the black matrix 110 (S100), forming the color filter layer 120 (S110, S120, and S130), and performing subsequent processes (S140).

In the fabrication method of the color filter substrate 100 according to an embodiment of the present invention, the type of a pattern constituting the color filter layer 120 and a sequence in which the pattern is formed are not limited. However, for convenience of description, it is assumed that the color filters 120R, 120G, and 120B of red (R), green (G), and blue (B) are fabricated sequentially.

In the formation of the color filters 120R, 120G, and 120B (S110 to S130), processes, such as cleaning, coating, exposure, development, curing, and inspection, are performed repeatedly.

A process of forming the color filter pattern 120R of red (R) is described in more detail below with reference to FIGS. 4A to 4G.

Before coating a color resist layer 121 of red (R), a transparent insulating substrate 100 is cleaned using a cleaning process, as shown in FIG. 4A. Moisture of the substrate 100 is then removed using a pre-baking process, as shown in FIG. 4B.

The cleaning process is performed to remove contamination and/or particles on a surface of the substrate 100 or a film formed on the substrate 100 during an initial load or process in order to prevent failure, enhance adhesive force of a thin film that will be deposited later on, and improve the characteristic of the thin film.

In the event that the color filter substrate for a LCD, as shown in FIG. 2, is fabricated, before the color filter layer 120R is formed, the black matrices 110 having a specific pattern and configured to define a pixel region are formed on the substrate 100.

The color resist layer 121 of red (R) is coated on the entire surface of the substrate 100, as shown in FIG. 4C.

The color resist layer 121 may be coated on the substrate 100 using a spin coating method or a slit nozzle. The spin coating method requires a great amount of color resist, but is most widely used because it has an excellently uniform thickness. When the size of the substrate 100 is too large not to perform spin coating, other methods such as a slit coating method may be used.

Figure 4D:
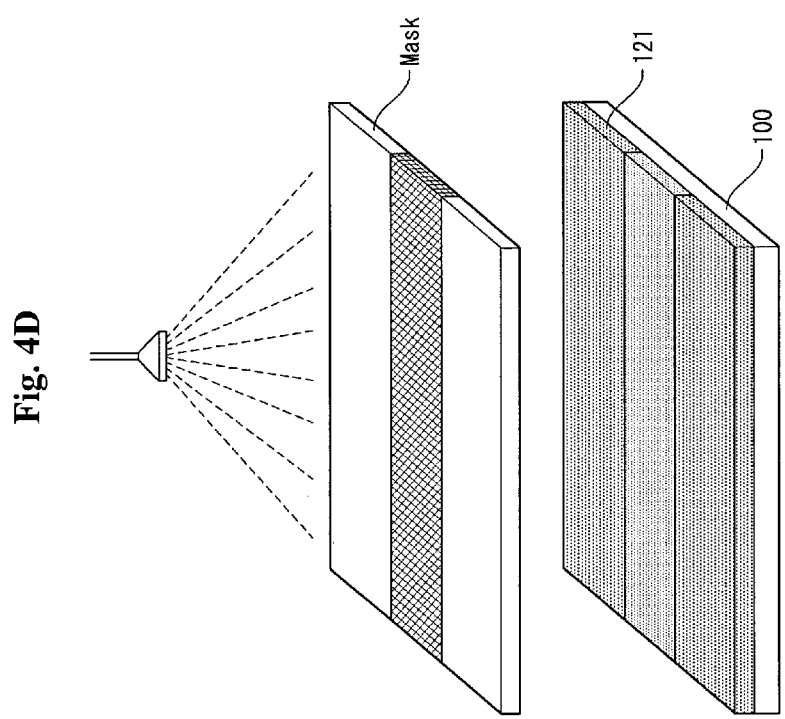

As shown in FIGS. 4D and 4E, the color filter pattern 120R of red (R) is formed by performing exposure and development processes. More specifically, after a mask is placed on the substrate 100, the color resist layer 121 is exposed so that a pattern drawn on the mask is transferred to the substrate 100.

The exposed color resist layer 121 is developed, thereby completing the color filter pattern 120R of red (R).

In the event that a negative photoresist is used in the color resist layer 121, portions that are not exposed are removed using a developer. This development may be performed using a dipping method, a puddle method, a shower spray method or the like. After development, the color filter pattern 120R is cured by radiating infrared rays to the substrate 100 through an infrared curing process, as shown in FIG. 4F.

Figure 4G:
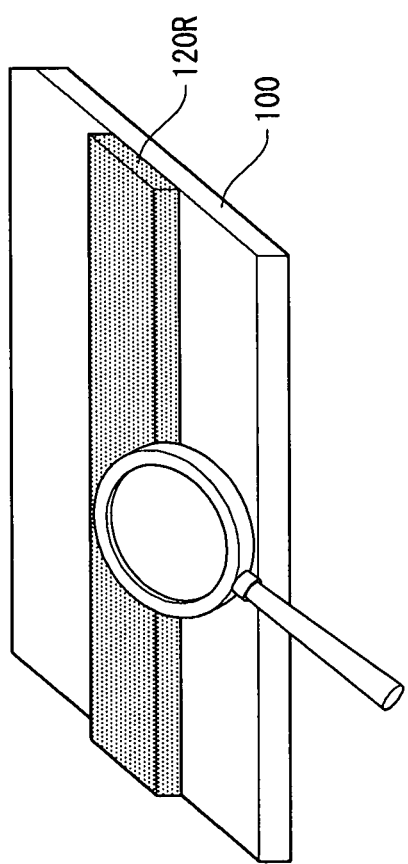

As shown in FIG. 4G, the substrate 100 on which the color filter pattern 120R is formed is inspected in order to check the degree of completeness of a unit process.

Thereafter, the color filter pattern 120G of green (G) is formed on the substrate 100 by repeatedly performing the cleaning, pre-baking, coating, exposure, development, infrared curing, and inspection processes shown in FIGS. 4A to 4E using a color resist of green (G).

In the exposure process of FIG. 4D, a method of moving a mask designed to have the same pattern by a pitch of the pixel regions and exposing and developing the mask may be used.

In the event that the color filter pattern 120G of green (G) is formed through this process, the color filter pattern 120G of green (G) is cured again using the infrared curing process and the inspection process is then performed, as shown in FIG. 4F.

Thereafter, the above processes are performed again using a color resist of blue (B), thus completing the color filter patterns 120R, 120G, and 120B of red (R), green (G), and blue (B).

The color filter patterns 120R formed in the stripe form are formed not to overlap with each other in the black matrix 110 for separating the pixel regions. The black matrix 110 has a width of 15 μm or more. Thus, when forming the color filter patterns 120R, 120G, and 120B, the pattern accuracy comparable to the level of a thin film transistor array is not required.

As described above, in the prior art, in order to form the color filter patterns of red (R), green (G), and blue (B), the post-baking process employing the thermal convection method must be performed on each of the color resist layers of red (R), green (G), and blue (B).

Accordingly, there are problems in which the same process must be repeated three times and a relatively long time is taken to cure the color filter patterns. Further, to remove external contamination by particles, which may be generated through the post-baking process, the pre-cleaning process must be performed every step.

If this related art post-baking process is substituted with the infrared curing process for directly heating the color filter patterns 120R, 120G, and 120B on the substrate 100 using infrared rays, a heating time can be reduced significantly when compared with the thermal convection method.

Meanwhile, since the possibility that particles can be generated in the substrate 100 due to the post-baking process is low, the cleaning process can be added selectively.

In the infrared curing process, the color filter patterns 120R and 120G of red (R) and green (G), which are formed firstly and secondly, are allocated only a heating time of a degree in which they can endure a subsequent development process instead of assigning the same heating time to the color resist layers 121 of red (R), green (G), and blue (B). When heating the color filter pattern 120B of blue (B) that is finally formed, an overall process time can be shortened so that the color filter patterns 120R, 120G, and 120B of red (R), green (G), and blue (B) can be heated sufficiently.

At this time, a coating sequence may be changed according to a difference in the development characteristic of each of the color resist layers 121 of red (R), green (G), and blue (B), and the number in which the infrared curing process is repeated can be reduced.

For example, if the color filter pattern 120R of red (R) has an excellent development margin, a pattern characteristic of the color filter pattern 120R can be maintained in the development process of the color filter pattern 120G of green (G) although the primary infrared curing process for heating is not performed.

Further, in the development process of the color filter pattern 120B of blue (B), a pattern characteristic may also be maintained along with the color filter pattern 120B of blue (B) in the development process performed without the heating process of the color filter patterns 120R and 120G of red (R) and green (G) (the primary and secondary infrared curing processes). Thus, the color filter patterns 120R, 120G, and 120B of the three colors can be cured and completed at a time through the development process to the ternary infrared curing and inspection processes.

In the event that the color filter substrate for a LCD as shown in FIG. 2 is fabricated, a subsequent process of forming the over-coating film 130 for covering the entire surface of the substrate 100, including the color filter patterns 120R, 120G, and 120B of red (R), green (G), and blue (B), the transparent electrode layer 140 coated on the over-coating film 130, and a column spacer (not shown) for uniformly maintaining a cell gap between the substrate 100 and a subsequent array substrate may be added.

At this time, to save the manufacturing cost of the color filter substrate, the process of forming the over-coating film 130 may be omitted by forming the color filter patterns 120R, 120G, and 120B to have an excellent taper angle.

Figure 5:
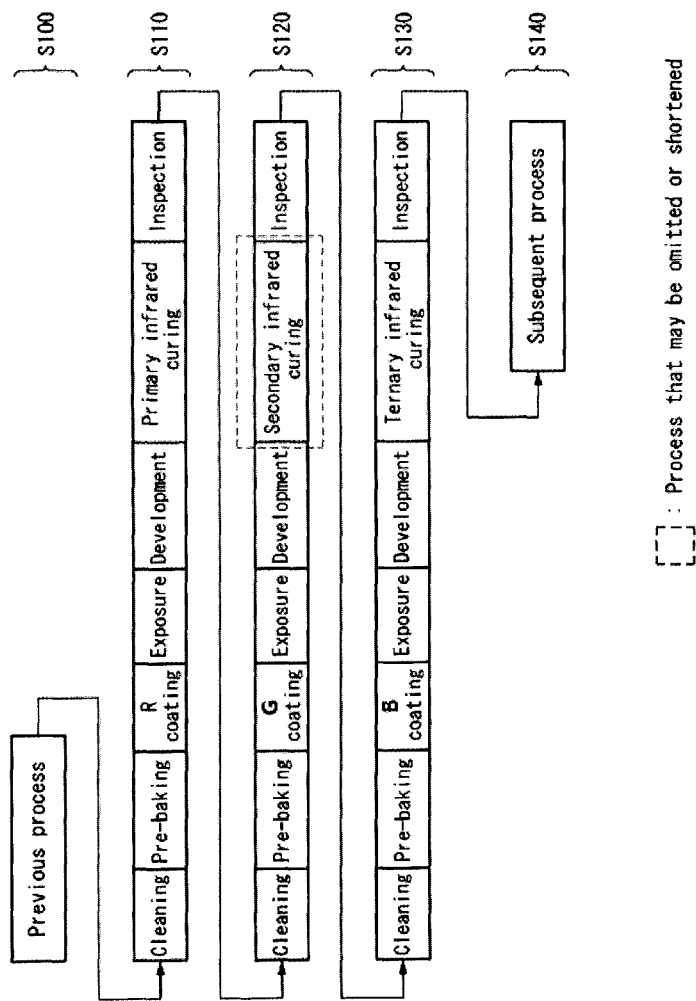
FIG. 5 is a view illustrating a method of fabricating the color filter substrate according to another embodiment of the present invention.

FIG. 5 is a view illustrating a method of fabricating the color filter substrate according to another embodiment of the present invention.

Basically, in the event that the color filter patterns 120R, 120G, and 120B of red (R), green (G), and blue (B) are sequentially formed, the color filter pattern 120R of red (R) is formed and then cured by irradiating infrared rays to the substrate 100 for a first intermediate heating time through a primary infrared curing process.

The color filter pattern 120G of green (G) is formed and then cured by irradiating infrared rays to the substrate 100 for a second intermediate heating time through a secondary infrared curing process.

In a similar way, after the color filter pattern 120B of blue (B) is formed, the color filter pattern 120B of blue (B) is cured through a ternary infrared curing process.

Referring to FIGS. 3 and 5, the heating time may be changed according to the type of the color resist layer 121 or the intermediate heating process itself may be omitted so that only a minimum margin with respect to a developer can be secured in the development process performed on each of the color filter patterns 120R, 120G, and 120B by modifying the basic process.

In other words, in the event that the color filter patterns 120R, 120G, and 120B of the three colors are sequentially formed, the color filter patterns 120R and 120G that are coated primarily and secondarily can be allocated an intermediate heating time of a degree in which they can endure a subsequent development process, and sufficient heating can be performed on the color filter patterns 120R, 120G, and 120B of the three colors in the color filter pattern 120B that is finally coated in order to shorten an overall process time.

At this time, when a color resist layer (for example, the color resist layer 121 of red (R)) that is first coated has a strong characteristic in which the shape of the pattern is maintained in the development process compared with color resist layers (for example, the color resist layers 121 of green (G) and blue (B)) that are coated next, the process efficiency and yield can be improved further.

The first and second intermediate heating times can be optimized according to the development characteristics of the color filter patterns 120R and 120G of red (R) and green (G) and have to be decided within a range in which the shapes of the color filter patterns 120R and 120G that are first coated can be maintained in a subsequent development process.

A final heating time has to be decided to have a value in which even the color filter pattern 120B of blue (B) as well as the color filter patterns 120R, 120G of red (R) and green (G), which are first coated, is fully cured. It is efficient to design the process so that the intermediate heating time is shorter than the final heating time.

Meanwhile, in the event that the related art thermal convection method was employed, it was necessary to raise a temperature within the chamber up to about 230 degrees Celsius and maintain the raised temperature for 30 minutes or more in order to fully cure the color filter patterns on the substrate 100.

In comparison, in the case of the heating method of directly irradiating infrared rays, if the substrate 100 is heated uniformly by irradiating a far infrared rays having a high output (for example, consumption power of 1 to 50 kW/m$^2$ level and a surface temperature of 50 to 500 degrees Celsius) and an excellent heating characteristic, the same level of effects can be obtained with only the process for about 5 minutes (3 to 7 minutes).

The turnaround time, investment cost, etc. of the color filter substrate can be saved by differentiating the heating time or omitting a corresponding process according to the type of the color filter patterns 120R, 120G, and 120B as described above.

Figure 6:
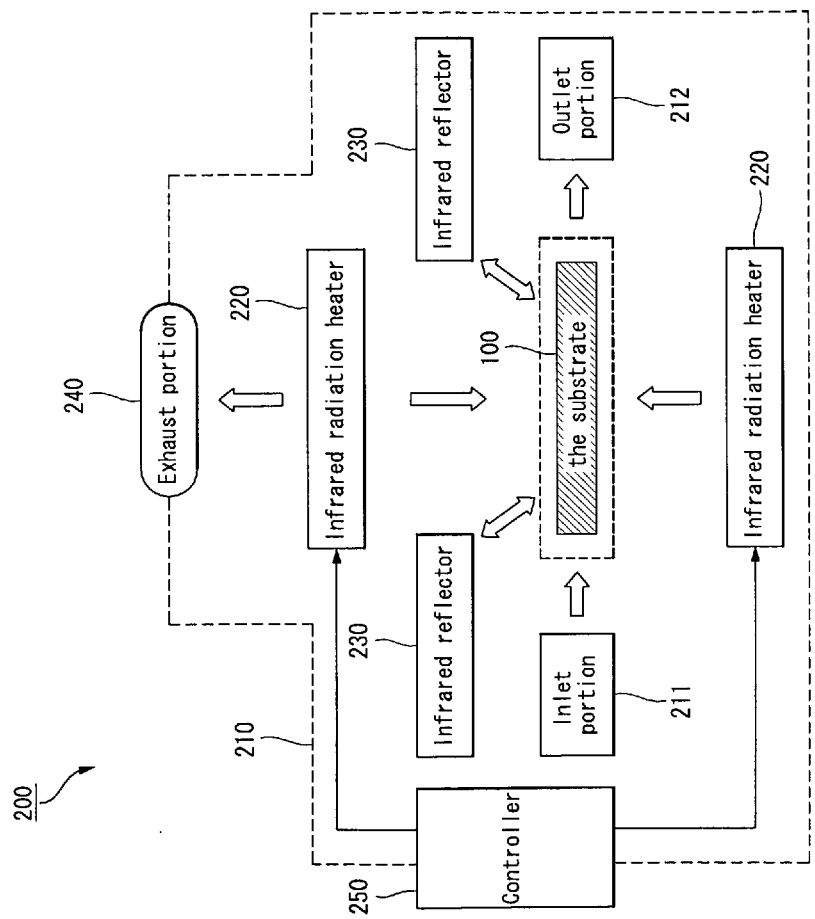
FIG. 6 shows a construction of an infrared heating apparatus according to an embodiment of the present invention.

FIG. 6 shows a construction of an infrared heating apparatus according to an embodiment of the present invention.

Referring to FIG. 6, an infrared heating apparatus 200 according to an embodiment of the present invention includes a main body portion 210, infrared radiation heaters 220, infrared reflectors 230, an exhaust portion 240, and a controller 250.

The main body portion 210 may have a structure surrounding an internal space, such as a rectangular box shape. An inlet portion 211 for receiving the substrate 100 to be heated is disposed on one side of the main body portion 210, and an outlet portion 212 for discharging the heated substrate 100 is disposed on the other side of the main body portion 210.

The main body portion 210 is adapted to receive the substrate 100 through the inlet portion 211, heat the received substrate 100 using an infrared irradiation method in order to cure the color filter patterns 120R, 120G, and 120B formed on the substrate 100, and then discharges the heated substrate 100 through the outlet portion 212.

The exhaust portion 240 for discharging gases, which are generated when heating the substrate 100, to the outside is disposed on an upper side of the main body portion 210. The infrared reflectors 230 for focusing infrared rays radiated from the infrared radiation heaters 220 are disposed on both internal sides of the main body portion 210. It is efficient when the infrared reflectors 230 are curved on the inner surface of the main body portion 210.

The infrared radiation heaters 220 are spaced apart from each other at a predetermined distance so that they are opposite to each other over the internal space of the main body portion 210, and are disposed on upper and lower portions of the introduced substrate 100. The infrared radiation heaters 220 function to irradiate infrared rays to the substrate 100 within the main body portion 210.

The infrared radiation heater 220 has a panel shape, which is heated at a high temperature to irradiate infrared rays of a high output. A body of the infrared radiation heater 220 may include a heating element heated by electric energy supplied externally and heats the surface of the panel at a high temperature, a heat insulating material formed to surround the outer wall of the heating element and block unnecessary loss of heat, a coating member for increasing the radiation efficiency of infrared rays, reinforcement and fixed members for reinforcing and protecting the structure of the infrared radiation heaters 220 and fixing the heating element.

If the substrate 100 enters the main body portion 210, infrared rays is radiated from the infrared radiation heaters 220 and then irradiated to the substrate 100. The infrared radiation heaters 220 uniformly heat the substrate 100, which is moved in a constant direction within the main body portion 210, in a non-contact manner by irradiating a far infrared rays having a high output (for example, consumption power of 1 to 50 kW/m$^2$ and a surface temperature of 50 to 500 degrees Celsius) and an excellent heating characteristic for about 5 minutes (3 to 7 minutes).

Accordingly, even the substrate 100 of a large area can be heated rapidly and uniformly in a non-contact manner.

The controller 250 controls the infrared radiation heaters 220 to adjust the heating time of the substrate 100. The heating time of the substrate 100 may be varied according to a heating condition of each of the color filter patterns 120R, 120G, and 120B of red (R), green (G), and blue (B). For example, in the case of FIG. 3, the heating time of the substrate 100 may be set to a first intermediate heating time, a second intermediate heating time or a final heating time according to which one of the primary, secondary, and ternary infrared curing processes.

The infrared heating method can reduce an overall size of an apparatus, save energy, and greatly improve the productivity compared with the related art heating apparatus employing conduction or convection when transferring energy.

Meanwhile, as described above, the color filter patterns 120R, 120G, and 120B of red (R), green (G), and blue (B) formed on the substrate 100 are first formed in the sequence of color resist having a higher chemical-resistant property according to the number of development. The intermediate heating time is decided within a range in which the shape of one or more of the color filter patterns 120R, 120G, and 120B that have already been formed can be maintained in a subsequent development process. In the heating time employing infrared rays, it is efficient to set the primary and secondary intermediate heating times shorter than the final heating time.

Further, both or one of the primary and secondary intermediate heating times may be omitted selectively depending on the difference in the chemical-resistant property according to the number of development.

For example, the controller 250 may control the infrared radiation heaters 220 to cure all the color filter patterns 120R, 120G, and 120B of red (R), green (G), and blue (B) at a time by heating the substrate 100 on which the color filter patterns 120R, 120G, and 120B of red (R), green (G), and blue (B) are formed during the final heating time.

Alternatively, the infrared radiation heaters 220 may operate to heat the substrate 100 on which the color filter patterns 120R and 120G of red (R) and green (G) are formed during the intermediate heating time, cure the heated substrate 100, heat the substrate 100 on which the cured color filter patterns 120R and 120G of red (R) and green (G) and the color filter pattern 120B of blue (B) are formed during the final heating time, and then cure the heated substrate 100 again.

At this time, the substrate 100 that is heated has a very thin thickness and therefore the heating time has to be controlled adequately not to damage the substrate 100.

FIG. 7 is a view illustrating a case where part of the infrared heating apparatus shown in FIG. 6 is modified.

Referring to FIG. 7, an infrared heating apparatus 200 may be configured, in which one or more pairs of infrared radiation heaters 220a to 220d are arranged in parallel at regular distances, thus forming a plurality of stages, and a plurality of substrates 100 are introduced between the infrared radiation heaters 220a to 220d so that the substrates 100 are heated at a time.

At this time, if the plurality of stages are interconnected using a conveyor or an elevator and then in-lined with an exposure unit and a development unit at the front stage and an inspection unit at the rear stage, a carrier robot is unnecessary when introducing and discharging the substrate 100.

The plurality of stages may be arranged in a horizontal direction as shown in FIG. 7, view (a), and in a vertical direction as shown in FIG. 7, view (b), by controlling the arrangement direction of the infrared radiation heaters 220.

In accordance with the present invention, the post-baking process can be replaced with an infrared irradiation method with a rapid thermal transfer characteristic Further, in accordance with the present invention, a clean room space and operating expenses thereof, an equipment investment cost, and a turnaround time can be reduced, and therefore the yield and production efficiency can be improved.

Further, in accordance with the present invention, when performing a post-baking process on several substrates at a time, a carrier robot is unnecessary. Accordingly, the space can be utilized efficiently and the equipment availability can be increased.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a color filter substrate, comprising:
   coating a first color resist layer on an entire surface of a substrate;
   exposing the substrate;
   developing the exposed first color resist layer to form a first color filter pattern;
   coating a second color resist layer over the entire surface of the substrate;
   exposing the substrate;
   developing the exposed second color resist layer to form a second color filter pattern;
   partially curing the second color filter pattern by irradiating the substrate with infrared rays during an intermediate heating time;
   coating a third color resist layer over the entire surface of the substrate;
   exposing the substrate;
   developing the exposed third color resist layer to form a third color filter pattern; and
   simultaneously curing the first to the third color filter patterns by irradiating the substrate with infrared rays during a final heating time,
   wherein the intermediate heating time is decided within a range in which a shape of the first and second color filter patterns can be maintained in a subsequent development process, and
   wherein a coating sequence is selected according to a difference in a development characteristic of each of the first to third color resist layers such that a material for the first color resist layer is selected to maintain a pattern characteristic without a curing process, a material for the second color resist layer is selected to maintain a pattern characteristic with a partial infrared curing process, and a material for the third color resist layer is selected to have a pattern characteristic with complete infrared curing process.

2. The method of claim 1, wherein the intermediate heating time is shorter than the final heating time.

3. The method of claim 1, wherein the intermediate heating time ranges from 3 minutes to 7 minutes.

4. The method of claim 1, wherein the final heating time is decided to have a value in which the third color filter pattern is fully cured.

5. The method of claim 1, wherein each of the first and second color resist layers maintains a shape of a pattern during a development process compared with the third color resist layer that is coated subsequently.

6. The method of claim 1, wherein each of the first to third color resist layers includes one of color resists of red (R), green (G), and blue (B).

7. The method of claim 1, further comprising:
   before coating the first color resist layer on the entire surface of the substrate,
   cleaning the substrate; and
   removing moisture of the cleaned substrate using a pre-baking process.

8. The method of claim 1, further comprising:
   forming black matrices on the substrate before the first color resist layer is coated; and
   forming an over-coating film over the substrate on which the third color filter pattern is formed.

9. The method of claim 8, further comprising forming a transparent electrode layer on the over-coating film.

* * * * *